United States Patent
Goetting et al.

[19]

[11] Patent Number: 5,815,404
[45] Date of Patent: Sep. 29, 1998

[54] METHOD AND APPARATUS FOR OBTAINING AND USING ANTIFUSE TESTING INFORMATION TO INCREASE PROGRAMMABLE DEVICE YIELD

[75] Inventors: F. Erich Goetting, Cupertino; David P. Schultz, San Jose; David B. Squires, Palo Alto, all of Calif.

[73] Assignee: Xilinx, Inc., San Jose, Calif.

[21] Appl. No.: 543,531

[22] Filed: Oct. 16, 1995

[51] Int. Cl.[6] .......................... G01R 31/07; G06F 17/18; G11C 29/00
[52] U.S. Cl. .......................... 364/489; 702/134; 702/171; 371/22.2
[58] Field of Search ..................... 364/488–491, 364/578, 550, 580; 307/202.1, 465; 324/158 R, 158.1; 371/22.2, 22.35, 22.1; 430/313; 257/48; 365/201; 326/38, 40; 395/183.01, 183.06, 183.07, 183.13, 183

[56] References Cited

U.S. PATENT DOCUMENTS

| | | | |
|---|---|---|---|
| 4,718,042 | 1/1988 | Moll et al. | 365/201 |
| 5,272,388 | 12/1993 | Bakker | 307/201.1 |
| 5,341,092 | 8/1994 | El-Ayat et al. | 324/158 R |
| 5,349,248 | 9/1994 | Parlour et al. | 307/465 |
| 5,430,734 | 7/1995 | Gilson | 371/22.2 |

OTHER PUBLICATIONS

El–Ayat, K. A. et al. ("An architecture for electrically configurable gate arrays", IEEE Journal of Solid–State Circuits, vol. 24, No. 2, Apr. 1989, pp. 394–398).

Roy, K. ("On Fault modeling and fault tolerance antifuse based FPGAs", IEEE, Proceedings of the 1993 IEEE International Symposium on Circuits and Systems, vol. 3, 3 May 1993, pp. 1623–1626).

*Primary Examiner*—Emanuel Todd Voeltz
*Assistant Examiner*—Phallaka Kik
*Attorney, Agent, or Firm*—Adam H. Tachner; Crosby, Heafey, Roach & May; Jeanette S. Harms

[57] ABSTRACT

A method and apparatus for creating and utilizing a database of defective antifuses on a programmable logic device and comparing the list to a catalog of required connections in a design, wherein the process of comparing the two lists will determine whether the device, although flawed, is nonetheless compatible with the design to be implemented, thereby increasing device yield.

39 Claims, 7 Drawing Sheets

METHOD AND APPARATUS FOR OBTAINING AND USING ANTIFUSE TESTING INFORMATION TO INCREASE PROGRAMMABLE DEVICE YIELD

BACKGROUND OF THE INVENTION

1. Field of the Invention

The present invention relates to programmable logic devices, and more particularly to programmable devices having an antifuse-based programmable interconnect structure.

2. Description of the Related Art

FPGAs—SRAM and Antifuse

Field programmable gate arrays (FPGAs) comprise programmable logic blocks within a programmable interconnect structure for interconnecting the blocks. The logic blocks are programmed to perform a desired function and the interconnect structure comprises wire segments which may be connected to interconnect the logic blocks as desired. Interconnect structure architectures can include static RAM (SRAM) used in turning on transistors which interconnect the wire segments. Others are interconnected by the programming of antifuses, alterable insulators between contacts which are programmed by applying a voltage difference to the wire segments in contact with the two terminals at either end of the antifuse. The programming voltage difference applied is sufficient to induce a high current through the antifuse insulator, thereby making the antifuse highly conductive between the two terminals.

Typical Programming Method

To program an FPGA, a user typically enters a logic design into a computer using a schematic capture package or a hardware description language. The computer then proceeds through an elaborate set of steps to generate a list of transistors to turn on, antifuses to program, or both, to cause a particular device to implement the user's design. Typical steps for converting a user's logic design into a list of antifuses or transistors include 1) mapping the user's logic design into logic elements of a suitable device (sometimes referred to as "technology mapping"); 2) placing each portion of the user's logic into a corresponding logic cell in the device; and 3) routing the signals on particular wire segments to interconnect the portions of the user's logic to form the overall design.

Full Testability

When manufacturing FPGAs which are programmed by turning on transistors, it is possible to fully test the device before the device is sold to a customer who will program the device. Such full testing guarantees that all transistors operate properly, thereby enabling a very high yield of delivered devices successfully programmed by the user.

In contrast, because antifuse-based devices are one-time programmable, antifuse devices can not be tested for antifuse programmability before shipment to customers. Antifuse-based device interconnect structures only allow tests for nonconductivity of the antifuses in their unprogrammed state. Full testing (which includes determining whether each antifuse actually programs when subjected to the programming voltage) would destroy the programmability the customer requires.

Given the large number of antifuses that must be programmed in a typical antifuse-based FPGA, even relatively low antifuse failure rates can lead to unacceptably high device failure rates in the field, since every utilized antifuse in the device must be successfully programmed for the device to work as designed. To address this problem, some antifuse-based device manufacturers include extra test antifuses on the device which are programmed at the factory to determine if the device antifuses will program properly. If at least a predetermined number of these test antifuses fail to program, the entire part is usually rejected. However, successful testing of a small sample of antifuses does not guarantee the proper function of the actual antifuses intended for user programming. Simple statistical variation assures that even 100 percent test antifuse success does not guarantee a particular antifuse will program properly in the field. Thus, even with the use of test antifuses, a manufacturer will ship some number of devices which fail to function properly, and the perceived quality of the manufacturer's product suffers accordingly. Moreover, disposing of devices which are all but fully functional further increases costs to the manufacturer and, in turn, the user. It would be far more desirable to utilize antifuse-based devices with known and measurable imperfections.

Accordingly, there is a need for a preprogramming method of detecting and categorizing imperfect antifuses and for determining whether an imperfect antifuse-based device is, despite at least one antifuse on the device recognized as imperfect, nonetheless compatible with a design layout. Also needed in the art is a method for increasing antifuse-based device yield to increase manufacturers' rate of return from and users' confidence in one-time programmable devices.

Distribution of Programming Voltages and Acceptable Antifuse-Based Parts

FIG. 1 shows a prior art curve of voltage distribution and ranges over which available antifuse devices may be accepted or rejected. After the devices are manufactured and before they leave the factory, the devices are tested for a variety of purposes, including whether any of the antifuses become programmed under the highest operating voltage (for example seven volts) for which the device is rated. In an acceptable device, no antifuses will program at the device's highest rated operating voltage (which is always lower than the programming voltage). Currently, if any antifuses do become programmed during testing, the device must be rejected. Those devices in which antifuses become programmed below the maximum operating voltage are illustrated in the shaded region labeled FACTORY REJECT. Currently, these devices will not be sold to customers, and represent lost profits and/or increased costs.

Devices shipped to customers are programmed in the field at a programming voltage considerably higher than the operating voltage. Any device for which an antifuse was designated to be programmed but failed to program will be rejected in the field, and represents both lost reputation and lost profit to either the manufacturer or the user, or to both. Devices in which at least one antifuse failed to program are indicated by the shaded region FIELD REJECT. The middle region, labeled GOOD, shows a device in which all antifuses program at a voltage higher than the operating voltage and lower than the programming voltage which will be used in the field.

Acceptable Yield

One-time programmable logic devices which cost only a few dollars have been considered acceptable if the yield of successfully programmed devices is on the order of 95%; that is, they are acceptable if 95% of the devices shipped to customers fall into the category labeled GOOD. However, for an FPGA device costing several hundred dollars, a customer is not likely to be satisfied with a yield of successfully programmed devices of only 95%. The customer is more likely to prefer an even higher yield of successfully programmed devices to consider its money well spent. In other words, the customer is likely to require that no more than a very small percentage of received devices have antifuses which fail to program at the programming voltage used or which do not maintain their programmed state (either on or off) throughout the expected and required lifespan of the device. It falls to the manufacturer to cover the cost of yield loss one way or another, usually by shipping replacement devices or reimbursing the user for failed devices.

Achievable Yield

In a device having 700,000 antifuses, of which 2% or 14,000 are typically programmed for a design, a failure rate of 1 antifuse per million produces a yield of about 98.6%. A failure rate of 100 antifuses per million produces a yield of only 24.7%. Some companies have been programming antifuse chips at the factory according to customer specifications, in order to avoid burdening the user with the inconvenience of handling failed devices and to maintain a reputation for reliability. This inconvenient procedure offsets the utility of field programmability and increases the time required to turn a design into a programmed device.

The statistics become quickly worse for larger devices. In a larger device having 2.5 million antifuses of which 2% or 50,000 will be programmed, a failure rate of 1 antifuse per million produces a yield of about 95.1% and a failure rate of 100 antifuses per million produces a yield of only 0.7%. These poor yields exacerbate the difficulty of large scale manufacture of larger antifuse devices.

Accordingly, there is a need in the industry for a method of increasing one-time programmable device yield which enables the user to avoid wasteful and time consuming attempts at programming devices incapable of supporting a desired design layout.

Moreover, there is also concern in the industry about device longevity. An antifuse which might program at a very low voltage level (i.e., which has a thin insulator) is less likely to maintain a desired off state throughout the operating life of a device than an antifuse which programs only at a higher voltage level. It is therefore desirable to take into account predicted device longevity where especially low programming voltage predictions are found.

Accordingly, there is also a need in the industry for a method of testing antifuse based devices without programming them which provides the user who is especially concerned with long term device integrity the ability to raise the minimum acceptable anticipated programming voltage to ensure a minimum insulator thickness.

SUMMARY OF THE INVENTION

The present invention provides a method and apparatus for rapid preprogramming analysis of antifuse-based devices, discovery of antifuse imperfections, and comparison of imperfect devices with desired design layouts to determine compatibility and thereby increase yield despite known device imperfections, all without irreversibly programming the analyzed devices.

The present invention further provides a method and system for increasing antifuse-based programmable logic device yield by checking, before programming, compatibility of an antifuse-based programmable logic device with a design to be implemented in the device, the device having a plurality of wire segments and a plurality of antifuses which may be programmed to connect selected wire segments utilized in the design. A first step of the method includes determining a range of acceptable preprogramming voltage levels induced across any one of the plurality of antifuses at a predetermined current level, each voltage level within the range being indicative of the actual programming voltage of an analyzed antifuse. A second step includes measuring for each one of the plurality of antifuses a preprogramming voltage level required to induce the current level. A third step includes comparing the measured preprogramming voltage level for each one of the plurality of antifuses to the range of acceptable preprogramming voltage levels. A fourth step includes providing a first list in machine readable form, the first list including locations of a first subset of the plurality of antifuses, each one of the subset having a measured preprogramming voltage level which falls outside the range of acceptable preprogramming voltage levels. A fifth step includes providing a design in machine readable form, the design comprising a second list including locations of antifuses connecting wire segments utilized in implementing the design in the device. A sixth step includes comparing the second list to the first list and generating a third list of antifuse locations common to the first list and the second list. And finally, a last step includes determining, based upon the third list, whether the design can be correctly programmed on the device.

The method of the present invention further includes the above-listed steps wherein the subset comprises antifuses having measured preprogramming voltage levels below the range of acceptable preprogramming voltage levels.

The method of the present invention also includes the above-listed steps wherein the subset comprises antifuses having measured preprogramming voltage levels above the range of acceptable preprogramming voltage levels.

The method of the present invention also includes the above-listed steps wherein the first list is recorded on the device.

DETAILED DESCRIPTION OF THE PREFERRED EMBODIMENT

The present invention includes a method and structure for analyzing the electrical characteristics of an antifuse and thereby testing the antifuse for programmability and reliability without irreversibly programming the antifuse. Using the system and method of the present invention, one can determine whether a tested antifuse has electrical characteristics which fall either inside or outside an established acceptable range, thereby revealing whether the antifuse will program too easily, acceptably, or insufficiently at the anticipated programming voltage. Armed with this knowledge, one can increase device yield by utilizing otherwise useless devices for compatible designs.

Figure 4:
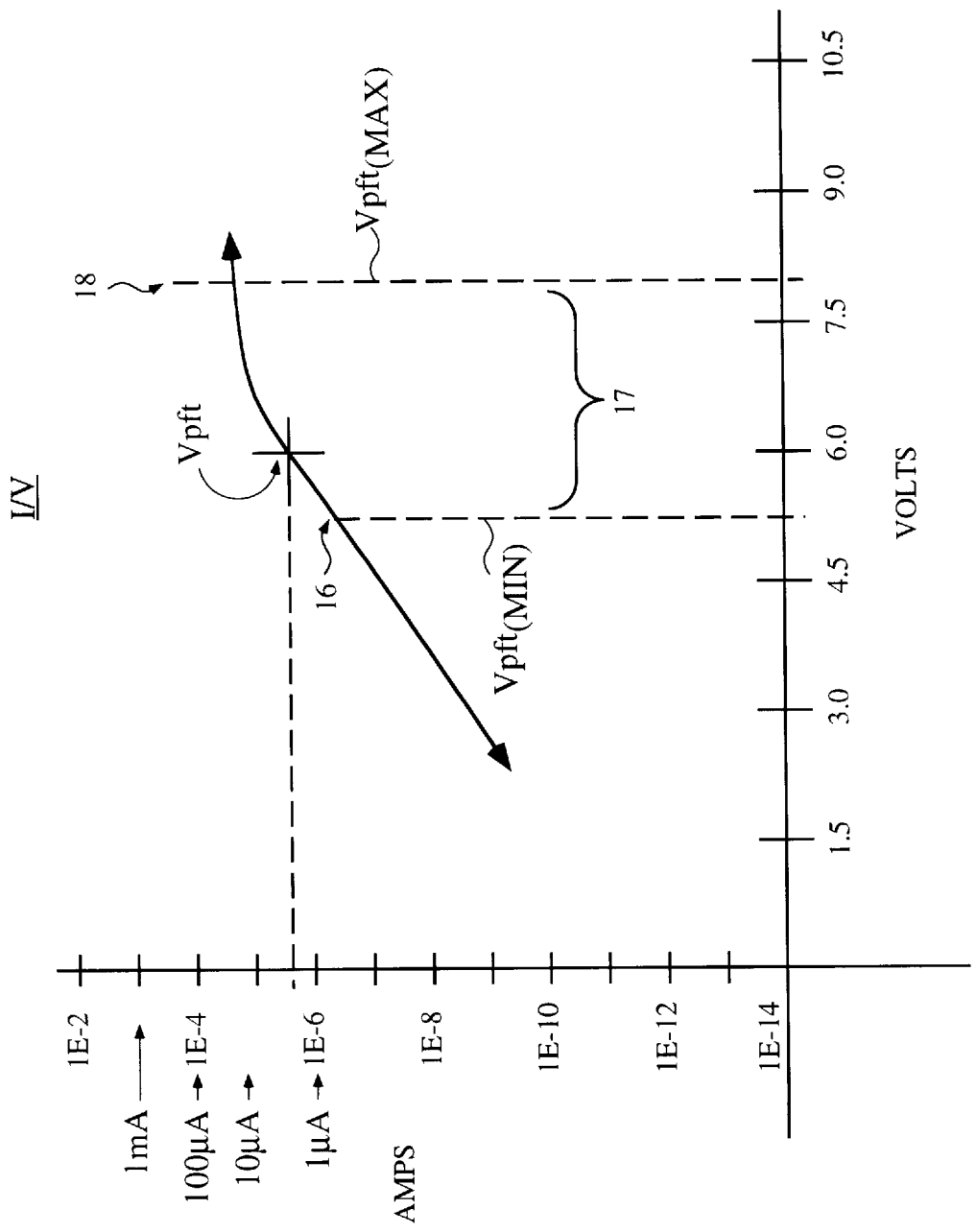
FIG. 4 is a line graph illustrating desirable preprogramming voltage and current response characteristics of a tested antifuse.

A preferred embodiment of the present invention includes the establishment of a desired range of antifuse characteristics used to predict programmability and reliability. Then, after an antifuse is tested as described below, recorded electrical characteristics of the tested antifuse can be compared to the established acceptable range of characteristics. The acceptable range 17 of readings within the characteristic curve of FIG. 4 lies between points 16 and 18. However, these points may be adjusted depending on the desires of the manufacturer or user.

In using the method of the present invention, obtaining an acceptable preprogramming reading from a tested antifuse will assure the manufacturer and user that the antifuse will be reliably programmed only when desired. The manufacturer and user will also be assured that a tested antifuse will not inadvertently program during the anticipated lifespan of a device implementing any desired layout. Obtaining an unacceptable or undesirable reading will allow the manufacturer to include knowledge of the imperfection in a data file for comparison with a users desired layout, thereby enabling the user or manufacturer to check for device/design compatibility despite the known imperfection, thereby increasing device yield and user satisfaction.

Acceptable Antifuse Programming Characteristics

Figure 2:
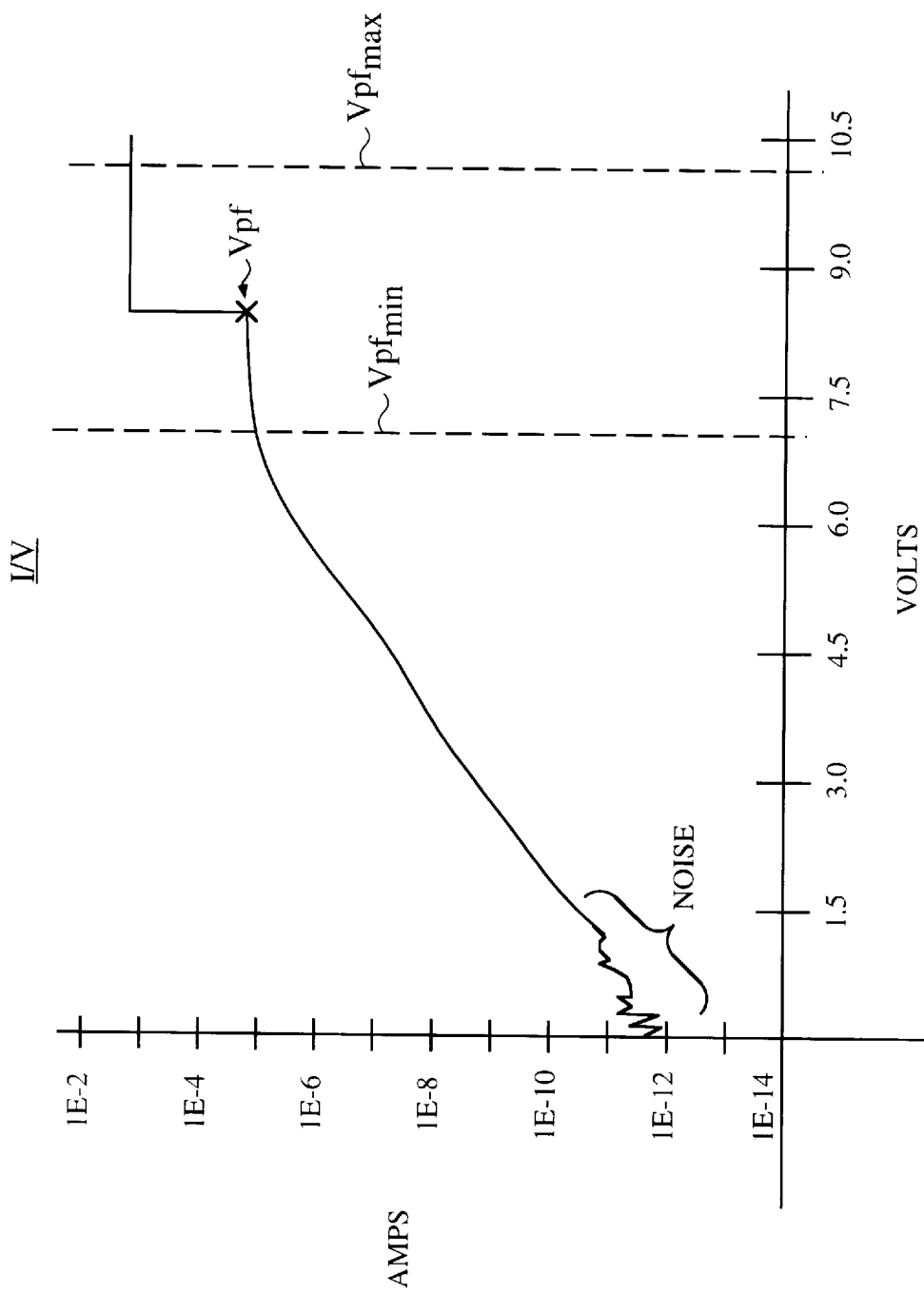
FIG. 2 is a line graph illustrating desirable programming voltage and current response characteristics of an antifuse.

The full characteristic current-voltage (I/V) curve of an acceptable antifuse, an example of which is shown in FIG. 2, may be obtained by inducing a range of small currents in the antifuse from a very low current to a sufficient programming current. The preferred induced current range for obtaining a complete curve is from about zero to as much as 10 milliamps (1E-02), thereby providing a complete response curve for the antifuse including the antifuse programming voltage. Other methods known to those skilled in the art may be used to create the characteristic curve illustrated in FIG. 2.

An acceptable programmed antifuse will have an actual programming voltage $V_{pf}$ which is within a range from $V_{pf(min)}$ to $V_{pf(max)}$. $V_{pf(max)}$ represents the maximum voltage which the programming circuitry of the antifuse-based device can accommodate within a predetermined safety margin. For optimal programming characteristics, $V_{pf(max)}$ should be as high as possible in order to create a stable antifuse with a long lifetime for a fixed operating voltage and with a very low probability of inadvertently programming during normal device operation. However, limitations external to the antifuse structure, such as allowed voltage levels in the device programming circuitry, limit $V_{pf(max)}$. $V_{pf(min)}$ represents the minimum programming voltage required for an antifuse having sufficient thickness to indicate a low probability of inadvertent programming when subjected to the anticipated post-programming operating voltage range. $V_{pf(min)}$ is required because an antifuse with a lower $V_{pf}$ would be more likely than desired to inadvertently program after long term exposure to the anticipated operating voltage range of the device.

Preprogramming Response as an Indicator of Programming Characteristics

Antifuse preprogramming I/V response characteristics relate to the programming characteristics of that antifuse. Since, as shown in FIG. 2, the I/V characteristics of a desirable antifuse are predominantly exponential (and appear as linear when plotted on a logarithmic scale) the antifuse programming voltage (accurately obtained only by irreversibly programming the antifuse) is related to the voltage induced by a known current below the programming level (a repeatable method of analysis). Thus, if an induced preprogramming voltage falls below the desired range, then the antifuse programming voltage is indicated as probably being too low. That antifuse may program inadvertently or may prove unreliable in the long term. Similarly, if the induced voltage is above the desired voltage range, then the antifuse programming voltage is probably too high and that antifuse may be unlikely to program when needed.

Figure 1:
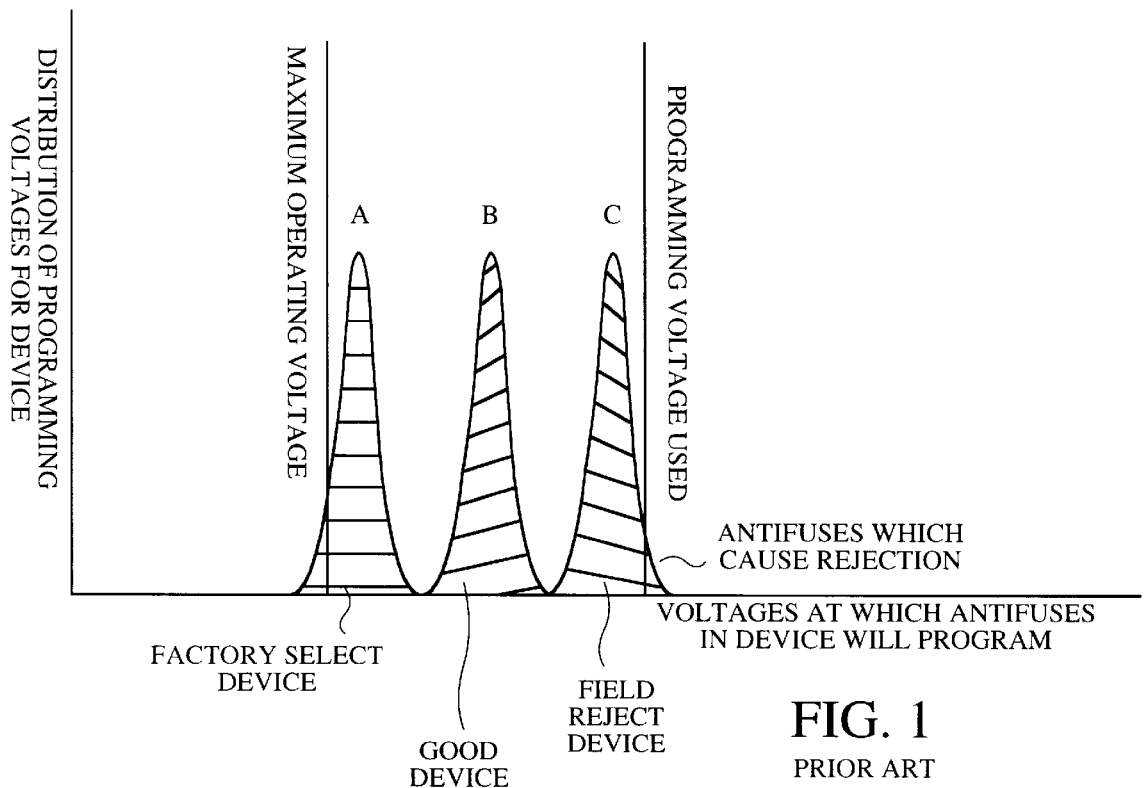
FIG. 1 shows a curve of voltage distribution and ranges over which devices are accepted and rejected after manufacture.
Figure 3:
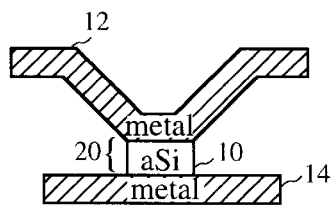
FIG. 3 illustrates an amorphous silicon (aSi) antifuse structure.

A preferred embodiment of the present invention includes a method for determining the preprogramming I/V characteristics of an antifuse, which is particularly dependent upon the thickness and structure of insulating layer 10 shown in the view of an amorphous silicon antifuse structure shown in FIG. 3. While FIG. 3 illustrates an amorphous silicon antifuse, the method and structure of the present invention apply to all antifuse structures known to the skilled artisan in the programmable logic device field.

Measurement of preprogramming antifuse I/V characteristics is preferably accomplished by inducing a slight test current, preferably on the order of one to ten microamperes, to the unprogrammed antifuse 20, while noting the voltage difference between metal layers 12 and 14 required to induce the test current. The applied voltage used to induce the test current should be sufficient to offset noise created by parasitic current leakage from transistor diffusion regions, other antifuses and various other leakage sources on the device. Similarly, the testing current should be low enough to avoid programming or permanently altering the antifuse structure, safely outside the range of voltages between $V_{pf(min)}$ and $V_{pf(max)}$. Other equivalent methods of determining the electrical characteristics, understood by those skilled in the art to which the present invention pertains, could be used to determine the preprogramming electrical response characteristics of the tested antifuse.

To better explain the relationship between derived preprogramming characteristics and likely programming behavior, we will define a series of antifuse preprogramming I/V response characteristics, shown in FIGS. 4, 5, 6 and 7 and their relative meanings. First, $V_{pft(min)}$ and $V_{pft(max)}$ are related to the minimum and maximum acceptable voltage levels, $V_{pf(min)}$ and $V_{pf(max)}$, at which the tested antifuse is required to program ($V_{pf}$). $V_{pft(min)}$ and $V_{pft(max)}$ therefore represent the minimum and maximum values at which the unprogrammed antifuse should reach the induced current level during the preprogramming test of the present invention. Clearly, $V_{pf}$ can be directly determined only by irreversibly programming the antifuse, thereby rendering the antifuse useless. Thus, $V_{pft(min)}$ and $V_{pft(max)}$ comprise a tool for predicting the $V_{pf}$ of the tested antifuse without programming the antifuse.

The lowest and highest acceptable programming voltages of dedicated test antifuses on the device, $V_{pf(min)}$ and $V_{pf(max)}$ (shown in FIG. 2), are determined according to the parameters outlined above. The minimum and maximum voltage levels for the induced test current, $V_{pft(min)}$ 16 and $V_{pft(max)}$ 18, are preferably related to the required values $V_{pf(min)}$ and $V_{pf(max)}$. If desired, either or both of the preprogramming extremes $V_{pft(min)}$ and $V_{pft(max)}$ can be retracted or extended in order to affect long-term device reliability and to obtain a greater or lesser cushion against programming failure.

$V_{pf}$ in FIG. 2 represents the actual programming voltage of a sample antifuse. Although the exact value of this characteristic cannot be determined without irreversibly programming the antifuse, an accurate estimate of the anticipated programming voltage can be obtained by measuring $V_{pft}$, the voltage drop across the antifuse terminals required to induce the predetermined test current level. Thus, to accurately predict antifuse programming characteristics, a range of acceptable test programming voltages is established for a device wherein $$V_{pft(min)} \leq V_{pft} \leq V_{pft(max)} \quad (1).$$

As noted above, in the preferred embodiment the test current should be high enough to avoid noise in the readings but low enough to avoid inadvertently programming or altering the antifuse structure. $V_{pft(min)}$ represents the lowest allowable induced preprogramming voltage within, for example, range 17 shown in FIG. 4, while $V_{pft(max)}$ represents the highest allowable induced preprogramming voltage. If the measured $V_{pft}$ is less than $V_{pft(min)}$, then the corresponding predicted $V_{pf}$ for the tested antifuse is too low. Likewise if $V_{pft}$ is greater than $V_{pft(max)}$, then the predicted $V_{pf}$ is too high.

Figure 5:
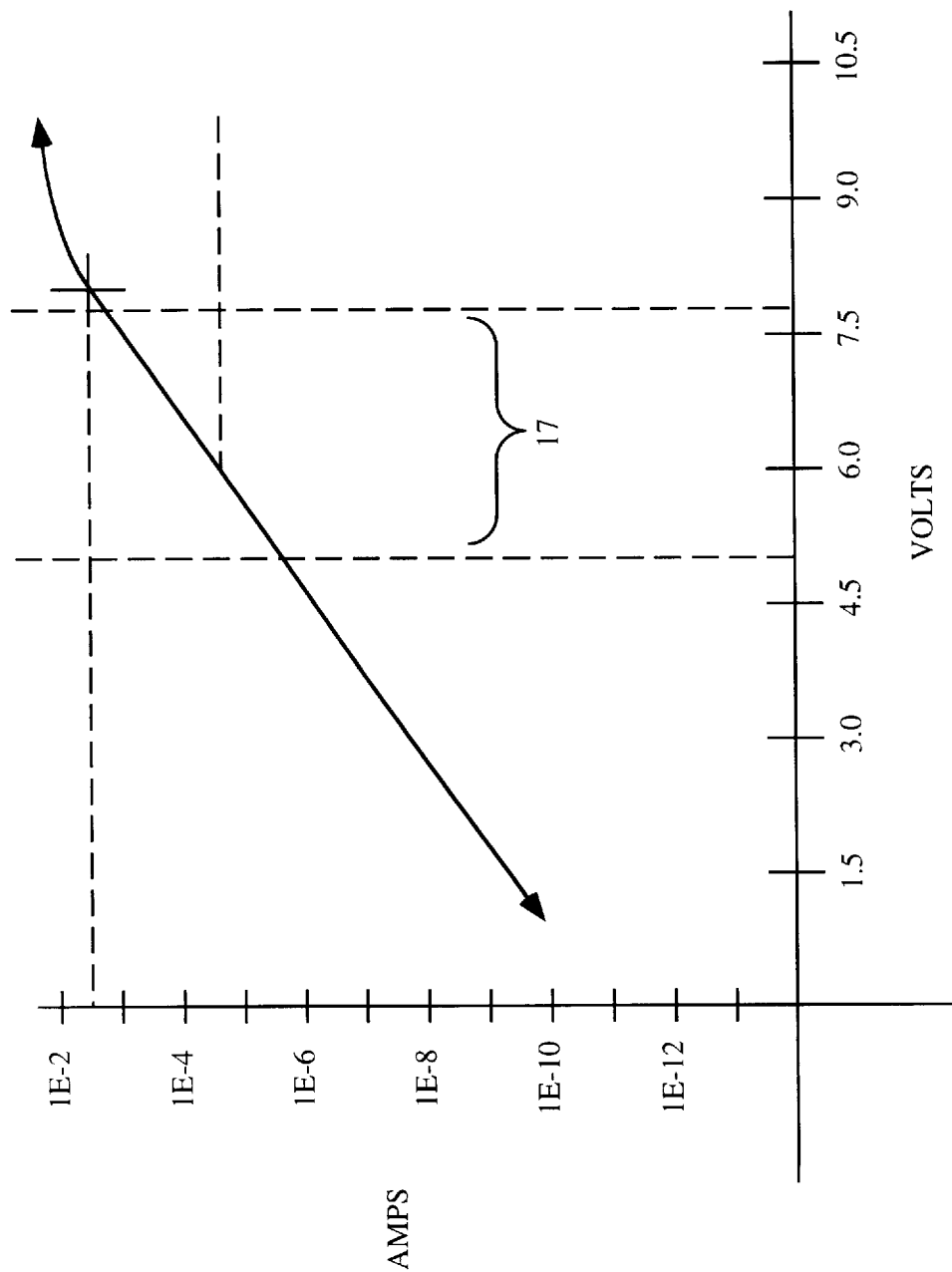
FIG. 5 is a line graph illustrating preprogramming voltage and current response characteristics of a first type of imperfect tested antifuse.
Figure 6:
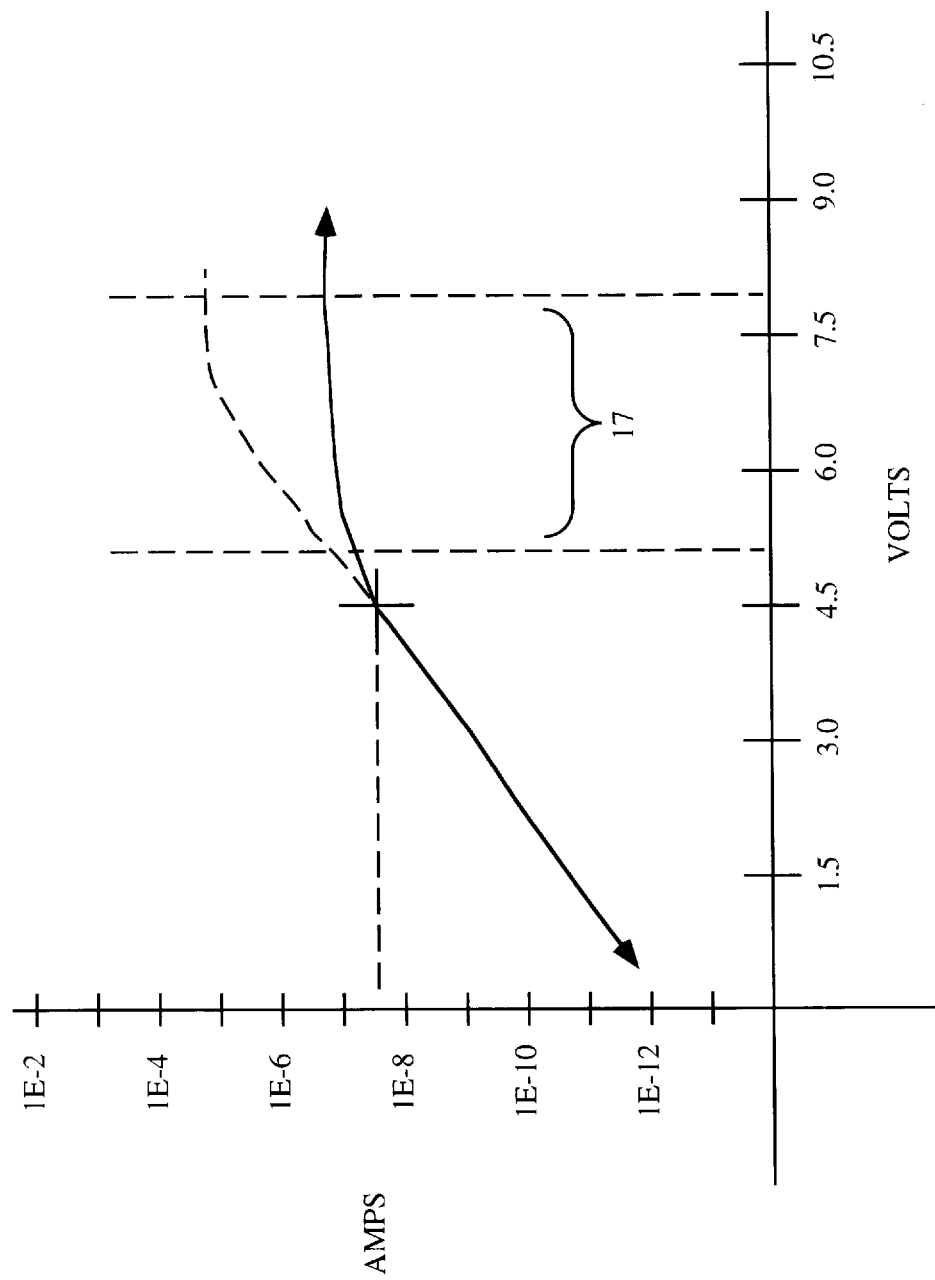
FIG. 6 is a line graph illustrating preprogramming voltage and current response characteristics of a second type of imperfect tested antifuse.

The preferred inventive method of antifuse I/V characteristic measurement for determination of device compatibility is performed at the factory after device manufacture, and can be performed in concert with other test procedures. First, the $V_{pft}$ of every antifuse for which testing is desired (normally all antifuses on a device) is measured and compared against the predetermined limits $V_{pft(min)}$ and $V_{pft(max)}$. Next, a data file is created including the locations of the imperfect antifuses that are unlikely to program when desired ($V_{pft}$ greater than $V_{pft(max)}$ as shown in FIG. 5) and those likely to program when not desired or likely to inadvertently program during the device's lifetime due to long-term exposure to the anticipated operating voltage ($V_{pft}$ less than $V_{pft(min)}$ as shown in FIG. 6). In a preferred embodiment, the data file of imperfect antifuses is recorded directly onto the device being tested. An onboard programmable read only memory (PROM) is one form of memory contained on FPGA devices which is accessible to the FPGA programmer (either the programming software or the person implementing the program) for checking against a final list of interconnects to be programmed into the device. Alternatively, the data file may be included with device programming software and include a stock or reference number for a particular device, or may be recorded separately from the programming software onto a memory medium transportable with the device. Preferably, only antifuse measurements which fall outside the desired range are stored, although complete device characteristic databases, including antifuses with desirable response characteristics similar to the one illustrated in FIG. 4, may be created if needed by the manufacturer or user.

Figure 7:
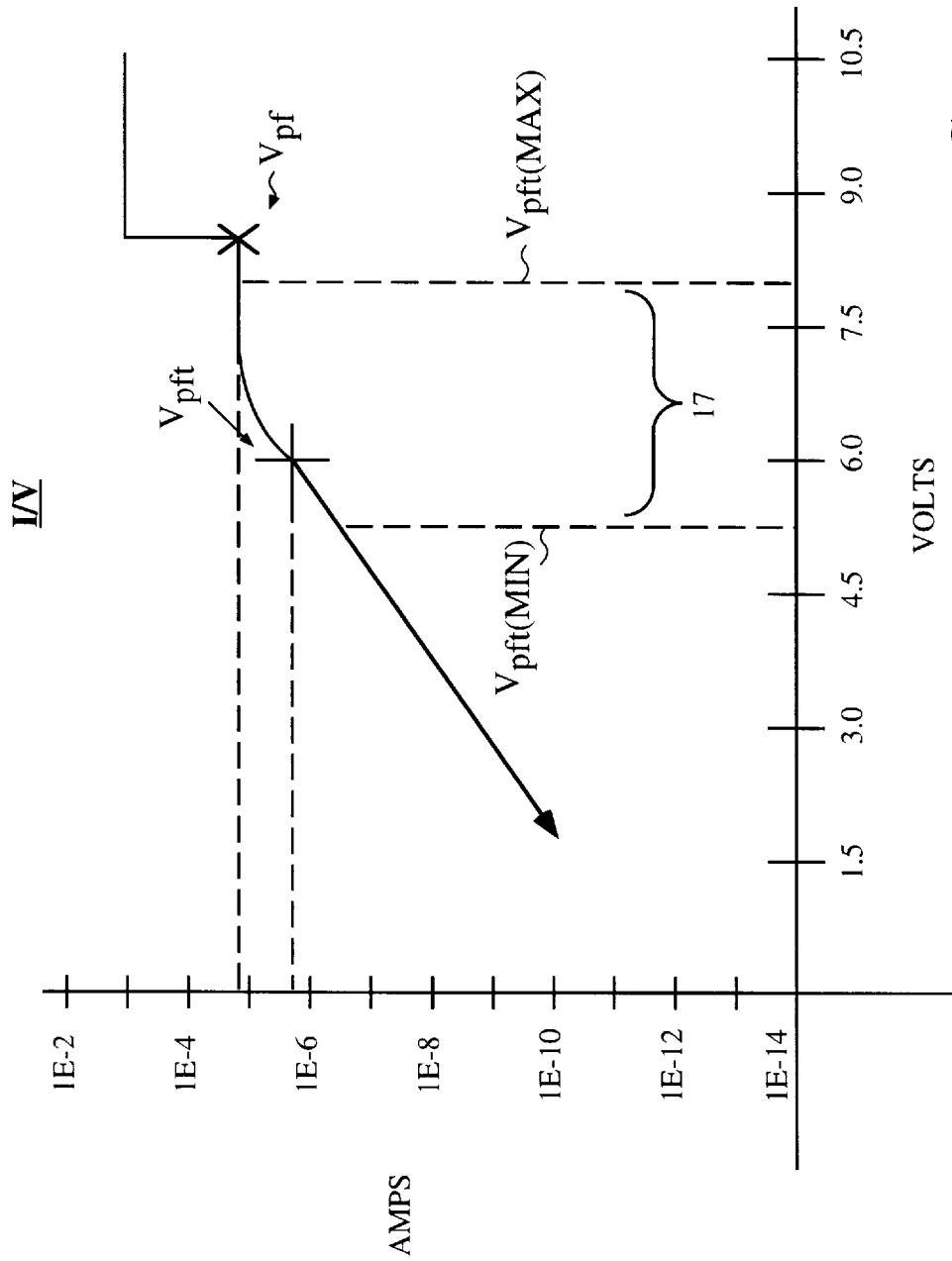
FIG. 7 is a line graph illustrating desirable preprogramming and programming voltage and current response characteristics of a tested and programmed antifuse.

FIG. 7 illustrates an effective preprogramming analysis using the method and system of the present invention. $V_{pft}$ is well within acceptable range 17 and the actual programming voltage $V_{pf}$ is, as shown for the desired antifuse in FIG. 2, between eight and nine volts.

Upon receipt of the FPGA, the customer will program the device with a particular desired design. The user's design comprises in part a list of programmed and unprogrammed antifuses. Because antifuse imperfection data is recorded on the device by the manufacturer, the user can implement a procedure wherein the data is read and compared to a list of antifuses within a design before programming to ensure compatibility.

For example, if a high $V_{pft}$ antifuse is to be programmed as an interconnect where both terminals contact live wire segments within a single network of interconnected wire segments (a "net"), then the antifuse will likely not program as needed and the device is not suitable for that design. On the other hand, if the high $V_{pft}$ antifuse is not required to be programmed in the design, then that particular imperfection is acceptable for the particular design desired by the user. For example, an antifuse with $V_{pft}$ greater than $V_{pft(max)}$ which is connected to only one utilized wire segment is tolerable since that antifuse does not need to be fused and is no more likely to accidentally fuse than any other antifuse on the device. Thus, the device containing that antifuse can be used for the desired design, despite the imperfection, thereby increasing the manufacturer's device yield and profitability and the user's confidence in the manufacturer's product.

The list of low $V_{pft}$ antifuses in the data file is then also compared to the design. If the antifuse is to connect two utilized wire segments, then the device remains acceptable since the antifuse is likely to successfully fuse and is therefore sufficient to ensure proper layout implementation.

A design wherein both terminals of a low $V_{pft}$ antifuse are connected to wires not utilized remains compatible with the flawed device, since a connection between two isolated wires will not affect design function or timing.

If only one terminal of a low $V_{pft}$ antifuse contacts a wire used in the design, the device and design are compatible unless capacitance charge resulting from an unwanted connection between wire segments will affect circuit timing and operability. A timing analysis can be done to determine what effect such additional charge may have. If circuit operability will be adversely affected, the device is rejected, otherwise, the device is accepted for the desired layout.

Finally, if an antifuse with a low $V_{pft}$ is positioned between utilized wires belonging to two distinct nets, then the device must be rejected since there is a strong likelihood that the two distinct nets will be fused together.

The preferred categorization of tested antifuses and design compatibility criteria are described in Table 1.

TABLE 1

| | ANTIFUSE TEST RESULTS | | |
|---|---|---|---|
| DESIGN NEEDS | $V_{pft} < V_{pft(min)}$ | $V_{pft(min)} \leq V_{pft} \leq V_{pft(max)}$ | $V_{pft} > V_{pft(max)}$ |
| TYPE 1 (critical) | OK | OK | INCOMPATIBLE |
| TYPE 2A (no wire) | OK | OK | OK |
| TYPE 2B (1 wire) | TIMING ISSUE | OK | OK |
| TYPE 2C (2 wire) | INCOMPATIBLE | OK | OK |

In Table 1, Type 1 antifuses are to be programmed as part of the desired design: that is, both terminals of the antifuse are attached to utilized wire segments which are to be interconnected. Predictable programming of Type 1 antifuses is therefore critical to implementation of the desired design. Thus, $V_{pft}$ for a Type 1 antifuse must be less than $V_{pft(max)}$ to ensure the antifuse will program even if the programming current is slightly less than anticipated.

Type 2 antifuses do not need to be programmed to implement the desired design. There are three categories of Type 2 antifuses. Type 2A antifuses are connected at both terminals to wires not utilized in the desired design. Thus, $V_{pft}$ for Type 2A antifuses does not affect design compatibility. Type 2B antifuses are connected to at least one utilized wire. As discussed above, compatibility of Type 2B antifuses with a desired design depends on the timing effect of additional capacitance charge potentially created by an unintentionally programmed antifuse connected to one utilized wire segment. Thus, a timing analysis must be done for Type 2B antifuses, where $V_{pft} < V_{pftmin}$ and unintentional programming resulting in the lengthening of a net is more likely than desired. Type 2C antifuses are connected at both terminals to utilized wire segments which are not to be connected in the desired design, and therefore require a minimum threshold of reliability against unintentional programming. Thus, $V_{pft}$ for Type 2C antifuses must be greater than $V_{pft(min)}$.

A key advantage of the present invention lies in the fact that any tested device which is incompatible with a given design can be checked again for compatibility with other designs and eventually programmed with a compatible design. The preprogramming test data is preferably retained on the device throughout its useful life and can be easily and repeatedly accessed until a compatible design is found. For example, if the user maintains a supply batch of devices, runs through the above-disclosed procedure before programming, and rejects 5% of the devices, the rejected devices may be retained and returned to the supply batch for another compatibility check with another design. Or, the devices might be returned to the manufacturer for credit and eventually redirected to another user with different design requirements.

Figure 8:
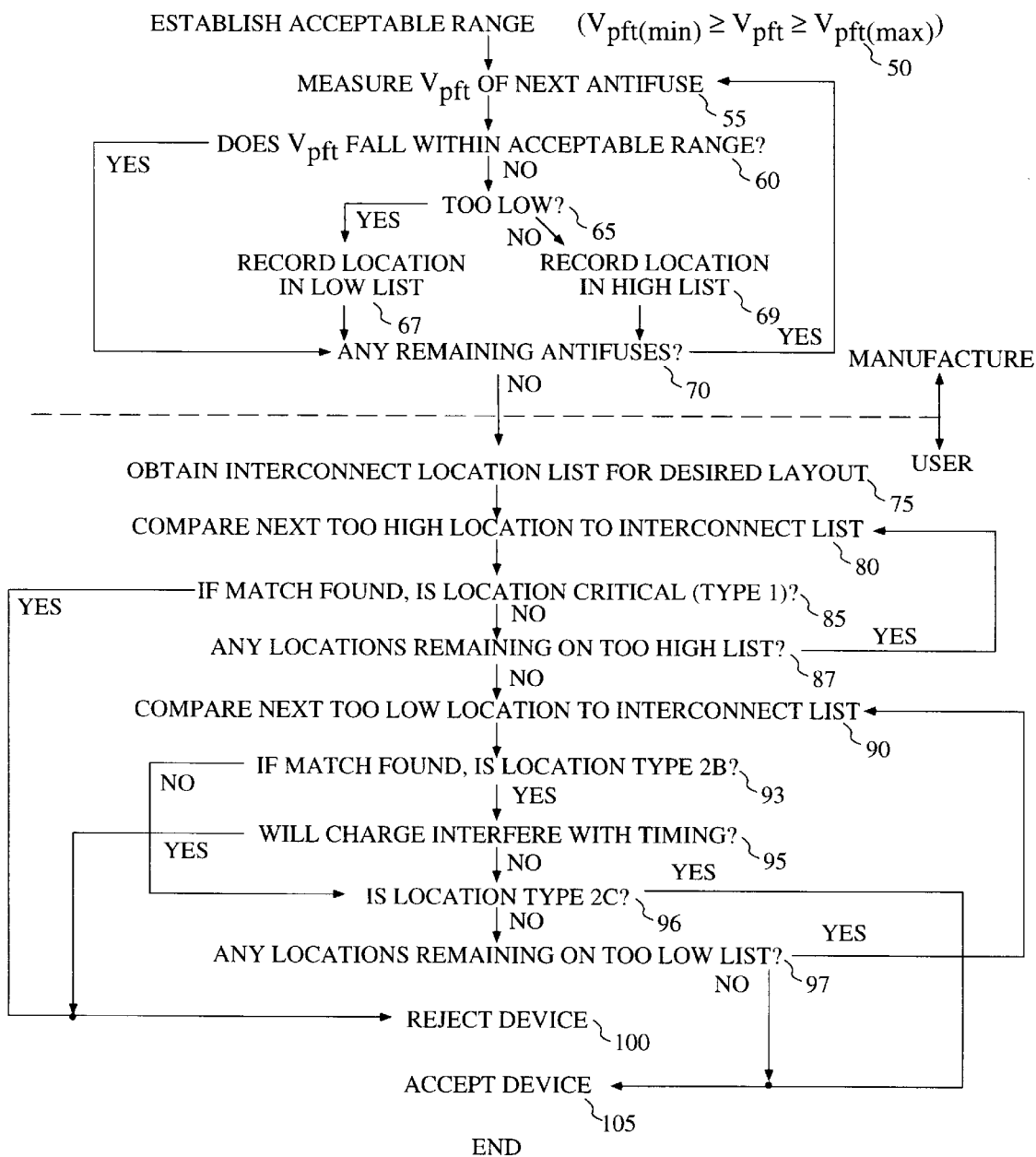
FIG. 8 provides a flow chart illustrating the method of the present invention.

To more clearly describe the preferred method of the present invention, FIG. 8 provides a flow diagram of the steps necessary to determine whether a flawed device is acceptable for a given design. At step 50, an acceptable range is established for a particular antifuse electrical characteristic. At step 55, a first antifuse is selected for testing and an electrical response is obtained for a selected voltage or current level. The electrical response is then compared to the acceptable range at step 60. If the reading falls outside the acceptable range, the location of the antifuse is stored in an appropriate file for the imperfection type at steps 65–69. The analysis is repeated for every antifuse on the device. As shown, steps 50 though 69 are preferably performed at the manufacturing facility. Steps 70 through 100 are preferably performed at the user's facility. The interconnect location list for the desired design is obtained and compared to the imperfection file or files at step 75. At steps 80 through 100, if a common location is found, the appropriate follow-up tests are performed to determine the effect of the imperfection on the desired layout. The device is then accepted or rejected based upon the results of the analysis outlined above.

While the present invention has been described with reference to certain preferred embodiments, those skilled in the art will recognize that various modifications and other embodiments may be provided. These other embodiments are intended to fall within the scope of the present invention. For example, any means known in the art for accessing and checking the pre-programming resistance or other electrical characteristic of an interconnect antifuse may be used. These and other variations upon and modifications to the embodiment described herein are provided for by the present invention which is limited only by the following claims.

What is claimed is:

1. A method of categorizing an antifuse-based programmable logic device, said method comprising the steps of:
   testing said device for imperfections, before programming the device, by determining whether each one of a plurality of unshort circuited antifuses on said device is less likely than a predetermined likelihood to properly program; and
   recording said imperfections.

2. The method of claim 1, further comprising utilizing information about imperfections recorded in said recording step to determine device compatibility with a desired design.

3. The method of claim 1, wherein said testing step includes the steps of:
   a) determining a range of acceptable preprogramming voltage levels induced across any unshort circuited one of said plurality of antifuses at a predetermined current level, each voltage level within said range being predictive of the actual programming voltage of an analyzed antifuse;
   b) measuring for each one of said plurality of antifuses a preprogramming voltage level required to induce said predetermined current level;
   c) comparing said measured preprogramming voltage level for each one of said plurality of antifuses to said range of acceptable preprogramming voltage levels; and
   d) determining as an imperfection each of said antifuses having a measured preprogramming voltage level which falls outside said range of acceptable preprogramming voltage levels.

4. A method of increasing antifuse-based programmable logic device yield, where yield is defined as the percentage of manufactured devices which properly implement and retain a programmed circuit design, said method comprising the steps of:
   determining for each one of said unshort circuited antifuses of the unprogrammed device whether it is less likely than a predetermined likelihood to properly program and, if so, designating such an antifuse to be an imperfection of the unprogrammed device;
   comparing an imperfect unprogrammed device with a design to be implemented in said device by comparing a list of imperfect unprogrammed antifuses and their locations on the device to a list of antifuses and their function in the design;
   determining whether the imperfect unprogrammed device and the design are compatible by determining whether the imperfect antifuses will adversely affect the proper programming of the design into the device or the functional longevity of the design once implemented in the device; and
   if the imperfect unprogrammed device and the design are compatible despite the imperfections of the unprogrammed device, programming the imperfect device with the design.

5. The method of claim 4, wherein an imperfect antifuse which is more likely than a predetermined probability to program at a predetermined voltage level is incompatible with a design which calls for the imperfect antifuse to function as a high-resistance barrier between two wire segments utilized within the design.

6. The method of claim 4, wherein an imperfect antifuse which is more likely than a predetermined probability to program at a predetermined voltage level is incompatible with a design which calls for the antifuse to function as a high-resistance barrier between one wire segment utilized within the design and a second wire segment not utilized within the design, if said antifuse inadvertently programming would have an undesirable effect on the function or timing of the design.

7. The method of claim 4, wherein an imperfect antifuse which is less likely than a predetermined probability to program at a predetermined voltage level is incompatible with a design which calls for the imperfect antifuse to function as an electrical connector between two wire segments utilized in the design.

8. A method of increasing antifuse-based programmable logic device yield by checking compatibility of an antifuse-based programmable logic device, before programming an antifuse on the device, with a design to be implemented in said device, said device having a plurality of wire segments and a plurality of antifuses which may be programmed to connect selected wire segments utilized in said design, said method comprising the steps of:
   a) determining a range of acceptable preprogramming voltage levels induced across any one of said plurality of antifuses at a predetermined current level, each voltage level within said range being indicative of the actual programming voltage of an analyzed antifuse;
   b) measuring for each one of said plurality of antifuses a preprogramming voltage level required to induce said current level;
   c) comparing said measured preprogramming voltage level for each one of said plurality of antifuses to said range of acceptable preprogramming voltage levels;
   d) providing a first list in machine readable form, said first list including locations of a first subset of said plurality of antifuses, each one of said subset having a measured preprogramming voltage level which falls outside said range of acceptable preprogramming voltage levels;
   e) providing a design in machine readable form, said design comprising a second list including locations of antifuses on said device;
   f) comparing said second list to said first list and generating a third list of antifuse locations common to said first list and said second list; and
   g) determining, based upon said third list, whether said design can be correctly programmed on said device.

9. A method as in claim 8 wherein said subset comprises antifuses having measured preprogramming voltage levels below said range of acceptable preprogramming voltage levels.

10. A method as in claim 8, wherein said subset comprises antifuses having measured preprogramming voltage levels above said range of acceptable preprogramming voltage levels.

11. A method as in claim 9 wherein said device and said design are found incompatible if said third list includes a location of a critical disconnection in said design, wherein a critical disconnection is defined as a nonconducting interface maintained through an antifuse between at least two utilized wire segments.

12. A method as in claim 9 wherein said third list includes a location of a non-critical interface between one utilized wire segment and one unutilized wire segment; and further comprising
   determining the effect on the timing of said design of an unintended connection at a non-critical interface on said device; and
   finding said device and said design incompatible if said effect on design timing of said unintended connection at a non-critical interface is greater than a predetermined quantity.

13. A method as in claim 10 wherein said device and said design are found incompatible if said third list includes a location of a critical connection in said design, wherein a critical connection is defined as a connection made through an antifuse between at least two utilized wire segments.

14. A method as in claim 8 in which said first list is recorded on said device.

15. A method as in claim 8 in which said first list includes antifuses which are unlikely to program when required in said design and antifuses which are likely to program when not required in said design.

16. A method as in claim 8, wherein said range has a minimum voltage and a maximum voltage, and in which step (a) comprises:
   identifying a first voltage level at which inadvertent programming of an antifuse is more likely than desired over the anticipated normal operating life of the device;
   establishing said minimum voltage as a function of said first voltage level;
   identifying a second voltage, higher than said first voltage, at which programming circuitry on said device cannot operate;
   establishing said maximum voltage as a function of said second voltage level.

17. The method of claim 16, wherein said manner of establishing said minimum comprises subtracting a predetermined amount of voltage from said first voltage level.

18. The method of claim 16, wherein said step of establishing said minimum voltage comprises calculating a predetermined percentage of said first voltage level.

19. The method of claim 16, wherein said manner of establishing said maximum comprises subtracting a predetermined amount of voltage from said second voltage level.

20. The method of claim 16, wherein said step of establishing said maximum voltage comprises calculating a predetermined percentage of said second voltage level.

21. A method for predicting the programming voltage of a first antifuse on an antifuse-based programmable logic device without programming the first antifuse or another antifuse on the device, said method comprising the steps of:
   inducing a current through said first antifuse;
   measuring the voltage required to induce said current;
   determining said programming voltage of said first antifuse in a manner dependent upon said measured voltage.

22. The method of claim 21, wherein said manner of determining said programming voltage comprises adding a predetermined amount of voltage to said measured voltage.

23. The method of claim 21, wherein said manner of determining said programming voltage comprises calculating a predetermined percentage of said measured voltage.

24. A system for increasing antifuse-based programmable logic device yield by checking compatibility of an antifuse-based programmable logic device, before programming an antifuse on the device, with a design to be implemented in said device, said device having a plurality of wire segments and a plurality of antifuses which may be programmed to connect selected wire segments utilized in said design, said system comprising:
   a) means for determining a range of acceptable preprogramming voltage levels induced across any one of said plurality of antifuses at a predetermined current level, each voltage level within said range being predictive of the actual programming voltage of an analyzed antifuse;
   b) means for measuring for each one of said plurality of antifuses a preprogramming voltage level required to induce said predetermined current level;
   c) means for comparing said measured preprogramming voltage level for each one of said plurality of antifuses to said range of acceptable preprogramming voltage levels;

d) means for providing a first list in machine readable form, said first list including locations of a subset of said plurality of antifuses, each antifuse of said subset having a measured preprogramming voltage level which falls outside said range of acceptable preprogramming voltage levels;

e) means for providing a design in machine readable form, said design comprising a second list including locations of antifuses connecting wire segments utilized in implementing said design in said device;

f) means for comparing said second list to said first list and generating a third list of antifuse locations common to said first list and said second list; and g) means for determining, based upon said third list, whether said design can be correctly programmed on said device.

25. A system as in claim 24 wherein said subset comprises antifuses having measured preprogramming voltage levels below said range of acceptable preprogramming voltage levels.

26. A system as in claim 24, wherein said subset comprises antifuses having measured preprogramming voltage levels above said range of acceptable preprogramming voltage levels.

27. A system as in claim 25, wherein said device and said design are found incompatible if said third list includes a location of a critical disconnection in said design, wherein a critical disconnection is defined as a nonconducting interface maintained through an antifuse between at least two utilized wire segments.

28. A system as in claim 25 wherein said third list includes a location of a non-critical interface between one utilized wire segment and one unutilized wire segment; and further comprising means for determining the effect on the timing of said design of an unintended connection at a non-critical interface on said device; and means for finding said device and said design incompatible if said effect on design timing of said unintended connection at a non-critical interface is greater than a predetermined quantity.

29. A system as in claim 26 wherein said device and said design are found incompatible if said third list includes a location of a critical connection in said design, wherein a critical connection is defined as a connection made through an antifuse between at least two utilized wire segments.

30. A system as in claim 24 in which said first list is recorded on said device.

31. A system as in claim 24 in which said first list includes antifuses which are unlikely to program when required in said design and antifuses which are likely to program when not required in said design.

32. A system as in claim 24, wherein said range has a minimum voltage and a maximum voltage, and in which (a) comprises:

means for identifying a first voltage level at which inadvertent programming of an antifuse is more likely than desired over the anticipated normal operating life of the device;

means for establishing said minimum voltage as a function of said first voltage level;

identifying a second voltage, higher than said first voltage, at which programming circuitry on said device cannot operate;

means for establishing said maximum voltage as a function of said second voltage level.

33. The system of claim 32, wherein said means for establishing said minimum comprises means for subtracting a predetermined amount of voltage from said first voltage level.

34. The system of claim 32, wherein said means for establishing said minimum voltage comprises means for calculating a predetermined percentage of said first voltage level.

35. The system of claim 32, wherein said means for establishing said maximum comprises means for subtracting a predetermined amount of voltage from said second voltage level.

36. The system of claim 32, wherein said means for establishing said maximum voltage comprises means for calculating a predetermined percentage of said second voltage level.

37. A system for predicting the programming voltage of a first antifuse on an antifuse-based programmable logic device without programming the first antifuse or another antifuse on the device, said system comprising:

means for inducing a current through said first antifuse;

means for measuring the voltage required to induce said current;

means for determining said programming voltage of said first antifuse in a manner dependent upon said measured voltage.

38. The system of claim 37, wherein said means for determining said programming voltage comprises means for adding a predetermined amount of voltage to said measured voltage.

39. The system of claim 37, wherein said means for determining said programming voltage comprises means for calculating a predetermined percentage of said measured voltage.

* * * * *